United States Patent
Wang et al.

(10) Patent No.: US 9,123,909 B2
(45) Date of Patent: Sep. 1, 2015

(54) ORGANIC LIGHT EMITTING DIODE DISPLAY

(71) Applicant: Samsung Display Co., Ltd., Yongin, Gyeonggi-Do (KR)

(72) Inventors: Seong-Min Wang, Yongin (KR); Mu-Gyeom Kim, Yongin (KR); Gug-Rae Jo, Yongin (KR); Dae-Young Lee, Yongin (KR); Jung-Gun Nam, Yongin (KR); Dae-Hwan Jang, Yongin (KR); Hyun-Jae Lee, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/036,490

(22) Filed: Sep. 25, 2013

(65) Prior Publication Data

US 2014/0306196 A1    Oct. 16, 2014

(30) Foreign Application Priority Data

Apr. 15, 2013  (KR) .......................... 10-2013-0041232

(51) Int. Cl.
  *H01L 51/00*  (2006.01)
  *H01L 51/52*  (2006.01)
  *H01L 51/56*  (2006.01)

(52) U.S. Cl.
  CPC ............ *H01L 51/52* (2013.01); *H01L 51/5271* (2013.01); *H01L 51/5281* (2013.01); *H01L 51/56* (2013.01)

(58) Field of Classification Search
  CPC . H01L 51/00; H01L 51/0545; H01L 51/0036; H01L 51/5012
  USPC ............................................... 257/40; 438/46
  See application file for complete search history.

(56) References Cited

U.S. PATENT DOCUMENTS

| | | | |
|---|---|---|---|
| 7,274,424 B1 * | 9/2007 | Kurihara et al. | 349/155 |
| 2004/0217681 A1 | 11/2004 | Park et al. | |
| 2008/0111483 A1 | 5/2008 | Kim et al. | |
| 2009/0190202 A1 * | 7/2009 | Moidu et al. | 359/291 |
| 2011/0121327 A1 | 5/2011 | Lee et al. | |
| 2012/0008205 A1 * | 1/2012 | Perkins et al. | 359/485.05 |
| 2012/0013827 A1 * | 1/2012 | Yoon | 349/96 |
| 2012/0160802 A1 * | 6/2012 | Kim et al. | 216/13 |
| 2013/0161178 A1 * | 6/2013 | Kim et al. | 200/600 |
| 2014/0241707 A1 * | 8/2014 | Johnson et al. | 392/411 |

FOREIGN PATENT DOCUMENTS

| | | |
|---|---|---|
| EP | 1 804 270 A2 | 7/2007 |
| EP | 1 965 233 A1 | 8/2007 |
| FR | 2 879 025 A1 | 12/2004 |

(Continued)

OTHER PUBLICATIONS

Extended European Search Report dated Sep. 29, 2014 for European Patent Application No. EP 14 160 932.1 which shares priority of Korean Patent Application No. KR 10-2013-0041232 with captioned U.S. Appl. No. 14/036,490.

*Primary Examiner* — Phuc Dang
(74) *Attorney, Agent, or Firm* — Knobbe Martens Olson & Bear LLP

(57) ABSTRACT

An organic light emitting diode display is disclosed In one aspect, the display includes a display panel, a grid layer positioned on the display panel, wherein the grid layer includes a plurality of protrusions formed of a first protrusion and a second protrusion formed on a surface of the first protrusion, and a window positioned on the grid layer.

10 Claims, 8 Drawing Sheets

(56) References Cited

FOREIGN PATENT DOCUMENTS

| | | |
|---|---|---|
| JP | 2004-349221 A | 12/2004 |
| JP | 2006-018303 A | 1/2006 |
| KR | 10-0958638 B1 | 5/2010 |
| KR | 10-2011-0039075 A | 4/2011 |
| KR | 10-2012-0021065 A | 3/2012 |
| KR | 10-2014-0037721 A | 3/2014 |
| WO | WO 2007/139210 A1 | 12/2007 |

* cited by examiner

ORGANIC LIGHT EMITTING DIODE DISPLAY

CROSS-REFERENCE TO RELATED APPLICATIONS

This application claims priority to and the benefit of Korean Patent Application No. 10-2013-0041232 filed in the Korean Intellectual Property Office on Apr. 15, 2013, the entire contents of which are incorporated herein by reference.

BACKGROUND

1. Field

The disclosed technology relates to an organic light emitting diode display and methods of making the same. More particularly, the organic light emitting diode display includes a grid layer.

2. Description of the Related Technology

An organic light emitting diode (OLED) is self-light emitting and unlike a liquid crystal display (LCD), it does not require a separate light source. Therefore, the thickness and weight of the OLED device is reduced and its flexibility is improved. Further, the OLED device has other beneficial qualities such as low power consumption, high luminance, and high activation speed.

Because an OLED device can be manufactured to have reduced weight and thickness, it is also useful for integration in portable electronics.

However, when the image of the OLED device is viewed outdoors, sunlight is reflected by a metal reflective layer, and the contrast and visibility of the device may be compromised.

In order to solve this problem, a circularly polarizing plate can be formed on the OLED device. However, an adhesion layer and a protection layer such as TAC are also required with the use of the polarizing plate to increase the thickness and strength of the device.

Accordingly, the use of polarizing plate can limit the flexibility of the OLED device and increase the rate of production defects caused by foreign particles caused by lamination of multiple layers.

The above information disclosed in this Background section is only for enhancement of understanding of the background of the disclosure and therefore it may contain information that does not form the prior art that is already known to a person of ordinary skill in the art.

SUMMARY OF CERTAIN INVENTIVE ASPECTS

The present disclosure has been made in an effort to provide an OLED device having an improved flexible characteristic and a reduced thickness.

In addition, the present disclosure has been made in an effort to provide an OLED device having increased visibility and contrast.

Some embodiments described herein provide an organic light emitting diode device including a display panel; a grid layer positioned on the display panel and including a plurality of protrusions formed of a first protrusion and a second protrusion formed on a surface of the first protrusion; and a window positioned on the grid layer.

In some embodiments, the first protrusion may be formed of Al (aluminum).

In some embodiments, a protection layer may be disposed between the first protrusion and the second protrusion and be formed of Ti (titanium) or Cr (chrome).

In some embodiments, a thickness of the protection layer may be ⅕ or less of the thickness of the first protrusion.

In some embodiments, the second protrusion may be formed of aluminum oxide and colored black.

In some embodiments, a height of the plurality of protrusions may be 150 nm or more, and an interval between the protrusions may be 50 nm or less.

In some embodiments, a thickness of the second protrusion may be 20 nm to 30 nm.

In some embodiments, the organic light emitting diode device may further include a touch panel positioned between the device panel and the grid layer.

In some embodiments, the organic light emitting diode device may further include a retardation layer positioned between the touch panel and the grid layer.

In some embodiments, the organic light emitting diode device can further include: an optical clear adhesive layer positioned between the touch panel and the grid layer.

In some embodiments, the window can be formed of a single layer or a plurality of layers including at least one of polycarbonate (PC), polymethyl methacrylate (PMMA), polyarylate (PAR), polyethersulfone (PES), polyethylene terephthalate (PET), and polyethylene naphthalate (PEN).

In some embodiments, the organic light emitting diode device can have increased contrast without adding a polarizing plate.

Further, since the thick polarizing plate is removed, the flexible characteristic of the organic light emitting diode device can be increased.

DETAILED DESCRIPTION OF THE EMBODIMENTS

Figure 1:
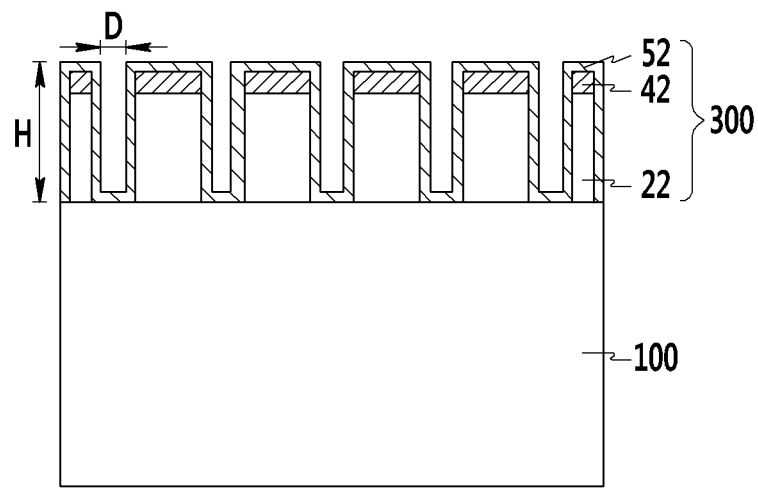
FIG. 1 is a cross-sectional view of a grid layer according to some embodiments.

The present disclosure will be described more fully hereinafter with reference to the accompanying drawings, in which the embodiments of the description are shown. As those skilled in the art would realize, the described embodiments may be modified in various different ways, all without departing from the spirit or scope of the present disclosure.

A portion that does not relate to the description is omitted in order to describe the present disclosure, and the same or like constituent elements designate the same reference numerals throughout the specification.

In addition, the size and thickness of each component shown in the drawings are arbitrarily shown for understanding and ease of description, but the present disclosure is not limited thereto.

In the drawings, the thickness of layers, films, panels, regions, and etc., are exaggerated for clarity. In the drawings, for understanding and ease of description, the thickness of some layers and areas is exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising", will be understood to imply the inclusion of stated elements but not the exclusion of any other elements. Further, in the specification, the word "on" means positioning on or below the object portion, but does not essentially mean positioning on the upper side of the object portion based on a gravity direction.

Hereinafter, an optical unit according to some embodiments of the present disclosure will be described with reference to the drawings.

FIG. 1 is a cross-sectional view of a grid layer according to some embodiments.

As illustrated in FIG. 1, the grid layer according to the present disclosure includes a plurality of protrusions 300 formed on a substrate 100. The substrate 100 may be a display panel including an organic light emitting diode.

The protrusions 300 include a first protrusion 22 protruding from the substrate 100 and a second protrusion 52 formed on a surface of the first protrusion 22.

The first protrusion 22 may be formed of a single metallic material such as aluminum. A protection layer 42 may be disposed between the first protrusion and the second protrusion. A protection layer 42 may be formed of titanium, molybdenum, chromium, or any combinations thereof. In some embodiments, the protection layer 42 can be formed to protect the aluminum of the first protrusion 22. The thickness of the protection layer 42 may be ⅕ or less of the thickness of the first protrusion 22.

The second protrusion 52 is formed of aluminum oxide. In some embodiments, the second protrusion 52 can be formed by anodization. In some embodiments, the second protrusion 52 may be black.

As shown in FIG. 1, the height (H) of the protrusion 300 may be 150 nm or more, and the interval (D) between the protrusions 300 may be 50 nm or less. The thickness of the second protrusion 52 may be 20 nm to 30 nm.

Figure 2:
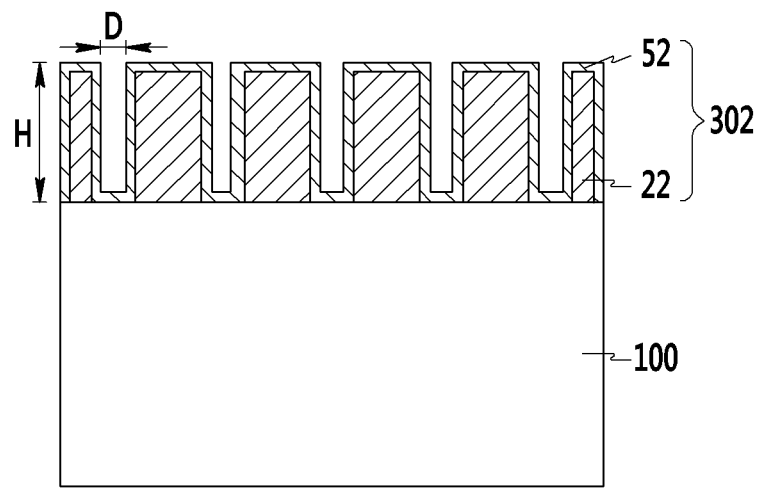
FIGS. 2 and 3 are cross-sectional views of a grid layer according to some embodiments.
Figure 3:
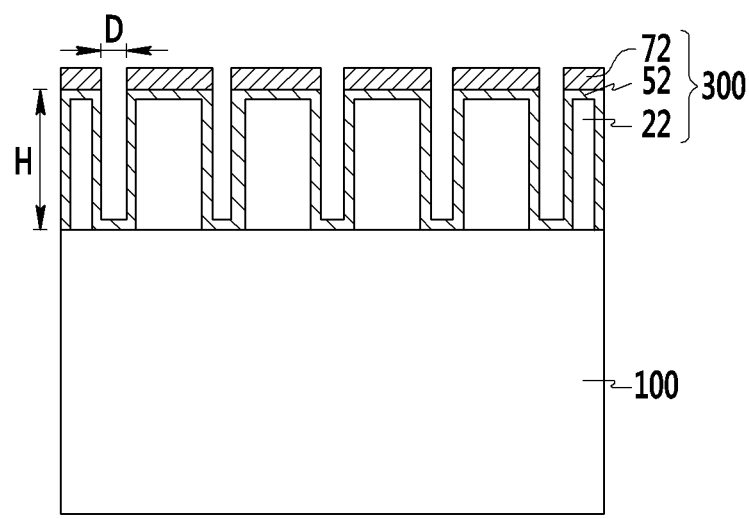

FIGS. 2 and 3 are cross-sectional views of a grid layer according to some embodiments.

As illustrated in FIG. 2, the grid layer according to the present disclosure includes a plurality of protrusions 302 formed on a substrate 100.

The protrusions 302 include a first protrusion 22 protruding from the substrate 100 and a second protrusion 52 formed on a surface of the first protrusion 22.

The first protrusion 22 is formed of a single material such as aluminum, and the second protrusion 52 is formed of aluminum oxide formed by anodization and is black.

In some embodiments, the height of the protrusion 302 may be 150 nm or more, and the interval between the protrusions 302 may be 50 nm or less. In some embodiments, the thickness of the second protrusion 52 may be about 20 nm to 30 nm.

The grid layer according to the present disclosure as illustrated in FIG. 3 includes a plurality of protrusions 302 formed on the substrate 100.

Since the protrusion of FIG. 3 is the same as the protrusion of FIG. 2, only a different portion will be specifically described.

The grid layer of FIG. 3 further includes a black matrix layer formed on the protrusion 302. The black matrix layer is formed of a material such as chromium oxide.

In some embodiments, when the grid layer is formed, an optical path transferring light from the OLED device to the outside can be provided, and the luminance of the OLED device is prevented from being reduced by incident light from the outside. Accordingly, the contrast of the organic light emitting diode display is improved.

The above feature will be specifically described with reference to FIG. 4.

Figure 4:
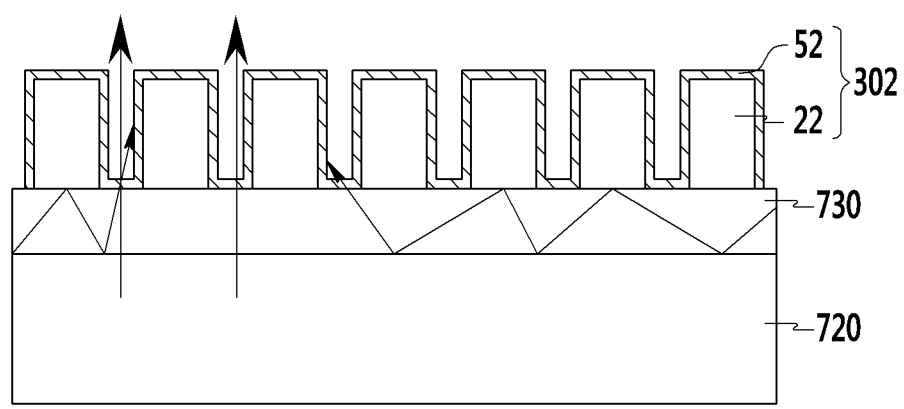
FIG. 4 is a view schematically illustrating an optical path of a grid layer according to the exemplary embodiment.

FIG. 4 is a schematic view illustrating an optical path of a grid layer according to some embodiments.

The grid layer of FIG. 4 is positioned on a cathode 730 of the OLED device. Accordingly, light transferred from an emission layer 720 passes through a space between protrusions 302 to be emitted to the outside.

In addition, since the external light is absorbed by the black second protrusion 52, reflection of the external light may be reduced. Accordingly, contrast of the OLED device may be improved.

Meanwhile, since the grid layer according to the embodiment is formed to have a thickness of 150 nm or less, the grid layer may replace a polarizing plate, which has a thickness of several tens microns. Therefore, the thickness of the organic light emitting diode display may be reduced. In addition, in the case where the organic light emitting diode display is formed of a flexible substrate, since the known polarizing plate of a thick and rigid material is not used, the flexible characteristic of the organic light emitting diode device can be improved.

Hereinafter, methods of manufacturing the grid layer of FIG. 1 will be specifically described with reference to FIGS. 5 to 12.

FIGS. 5 to 12 are cross-sectional views sequentially illustrating methods of manufacturing the grid layer according to some embodiments.

Figure 5:
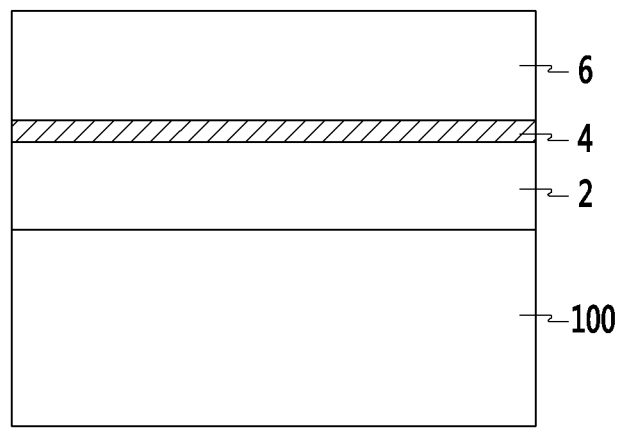
FIGS. 5 to 12 are cross-sectional views sequentially illustrating a method of manufacturing the grid layer according to the exemplary embodiment.

As illustrated in FIG. 5, a metal layer 2 is formed on a substrate 100, and a resist layer 4 is formed on the metal layer 2. The metal layer 2 is formed of aluminum. A protection layer 42 formed of metal such as molybdenum or titanium or an insulating material such as $SiO_2$ may be further included in order to protect the aluminum of the metal layer 2.

The resist layer 4 may be formed of a thermosetting polymer resin or a thermoplastic polymer resin.

The thermosetting polymer resin progresses in a sufficiently flowable state so that the resin flows into a pattern defined by a mold 500 when the thermosetting polymer resin comes into contact with the mold 500. In addition, the thermoplastic polymer resin may be heated to form a flowable state before being pressed by the mold 500, and may be heated to a temperature that is higher than a glass transition temperature of a general resin.

Examples of the thermoplastic polymer resin include but not limited to poly(methyl methacrylate), polystyrene, poly(benzyl methacrylate), poly(cyclohexyl methacrylate), or any combinations thereof.

Figure 6:
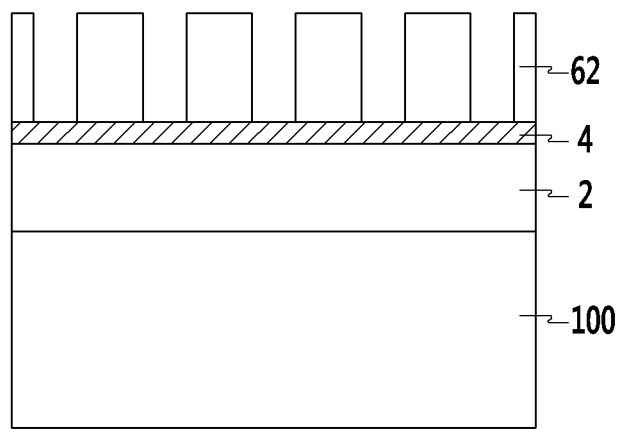

Next, as illustrated in FIG. 6, the resist layer is pressed by the mold 500 to allow the resin to flow into the pattern defined by the mold 500, and then cured to form a sacrificial pattern 62.

In some embodiments, when the resist layer is formed of the thermosetting polymer resin, the resist layer can be pressed by the mold, heated, and cured, and the mold is then removed. In the case where the resist layer is formed of the thermoplastic polymer resin, the resist layer can become a fluid by heating, and then be pressed by the mold. Thereafter, after the resist layer is cured by cooling, the mold is removed. The process of applying heat may be performed together with pressing.

Figure 7:
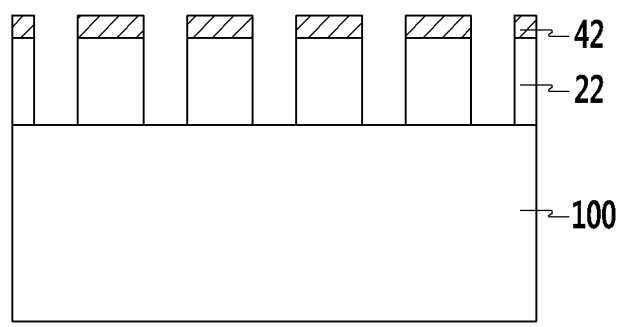

Next, as illustrated in FIG. 7, the protection layer and the metal layer are etched by using an etching mask to form first protrusions 22 and 42.

Next, as illustrated in FIG. 1, a second protrusion 52 is formed on the first protrusion 22. The second protrusion 52 may be formed by an anodizing process.

In the anodizing process, the substrate on which the first protrusion is formed is immersed in a diluted sulfuric acid solution at a concentration of 10% to 30%, and a voltage of 2 V to 10 V is applied to oxidize the surface of the first protrusion. In some embodiments, the second protrusion is formed to have a thickness of 20 nm to 30 nm.

In this case, the immersing is performed for 10 minutes to 2 hours when the sulfuric acid is at a temperature of the sulfuric acid solution of 10° C. to 20° C.

Thereafter, the color of the second protrusion 52 is changed into black by a coloring process.

The coloring process is performed in an aqueous solution including a dye for plating at a temperature of 60° C. to 70° C. for 5 mins to 50 mins. The second protrusion is colored to have a black color by the coloring process.

FIGS. 8 to 12 are views illustrating a method of manufacturing a grid layer according to some embodiments.

Figure 8:
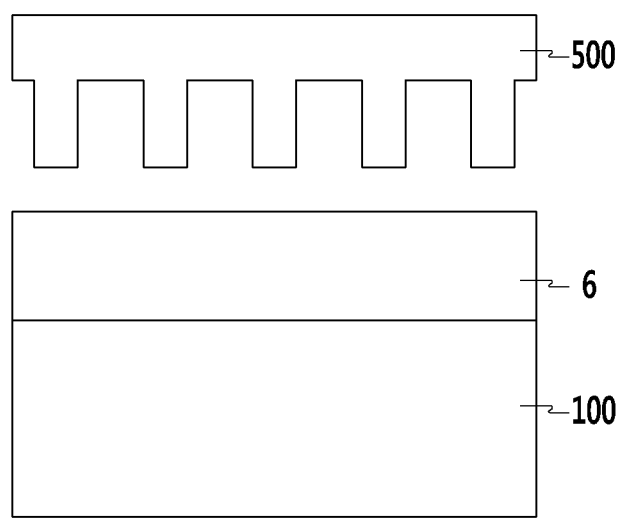

As illustrated in FIG. 8, a resist layer 6 is formed on a substrate 100, and a mold for imprint 500 is arranged.

Figure 9:
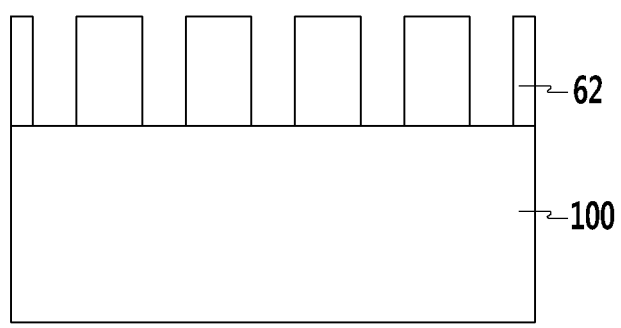

Next, as illustrated in FIG. 9, a sacrificial pattern 62 is formed by an imprint process. The imprint process is formed by the same method as FIG. 5.

Figure 10:
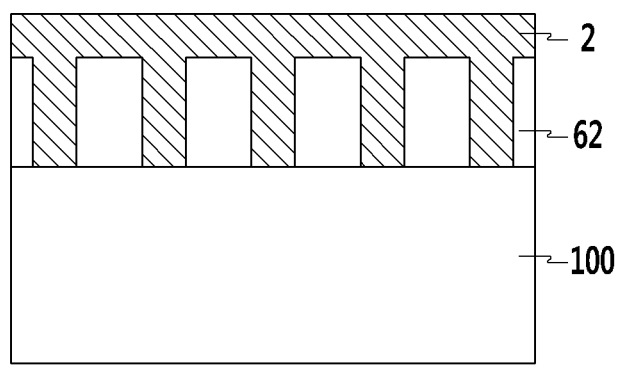

Next, as illustrated in FIG. 10, a metal layer 2 is formed to cover the sacrificial pattern 62. The metal layer 2 is formed of aluminum. The metal layer 2 is formed to fill an interval between the sacrificial patterns 62. The metal layer is formed of only aluminum in FIG. 10. In some embodiments, a protection layer may be formed on the metal layer 2.

Figure 11:
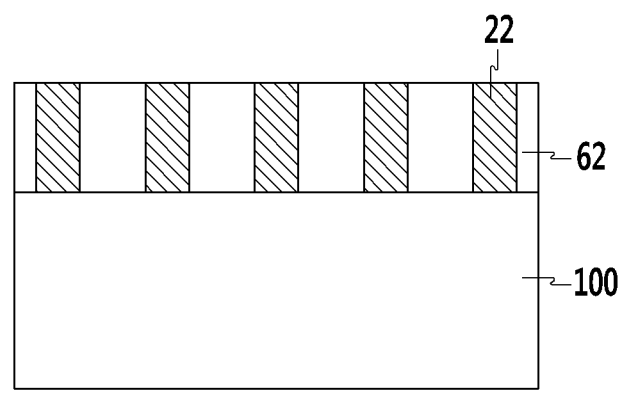

Next, as illustrated in FIG. 11, polishing is performed by a chemical mechanical planarization (CMP) process until the sacrificial pattern 62 is exposed.

Figure 12:
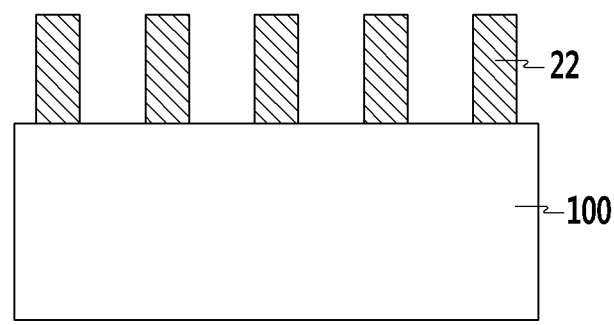

Next, as illustrated in FIG. 12, the sacrificial pattern 62 is removed to form a first protrusion 22.

Thereafter, as illustrated in FIG. 2, a second protrusion 52 is formed on the first protrusion 22. The second protrusion 52 may be formed by an anodizing process. Thereafter, the second protrusion 52 is colored to have a black color by a coloring process.

Hereinafter, an OLED device including the grid layer described in FIGS. 1 to 3 will be specifically described with reference to FIGS. 13 to 16.

Figure 13:
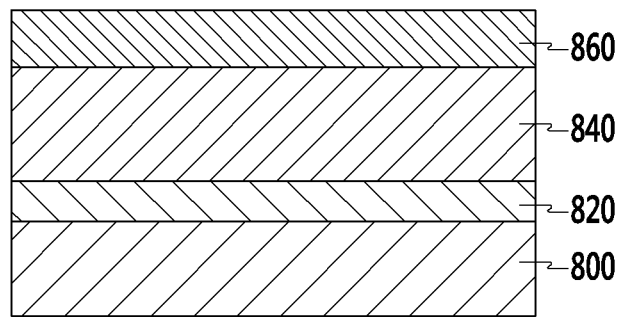
FIG. 13 is a schematic cross-sectional view of an organic light emitting diode device according to some embodiments.

FIG. 13 is a schematic cross-sectional view of an OLED device according to some embodiments.

As illustrated in FIG. 13, the OLED device may include a display panel 800, a touch panel 820 positioned on the display panel 800, a grid layer 840 positioned on the touch panel 820, and a window 860 positioned on the grid layer 840.

The display panel 800 may be an organic light emitting display panel including the organic light emitting diode. The organic light emitting display panel may include a substrate 100, and a plurality of pixels (not illustrated) formed on the substrate 100.

The substrate 100 may be a transparent insulating substrate formed of glass, quartz, ceramic, plastic, or the like, or the substrate 100 may be a metallic substrate formed of stainless steel or the like.

Figure 14:
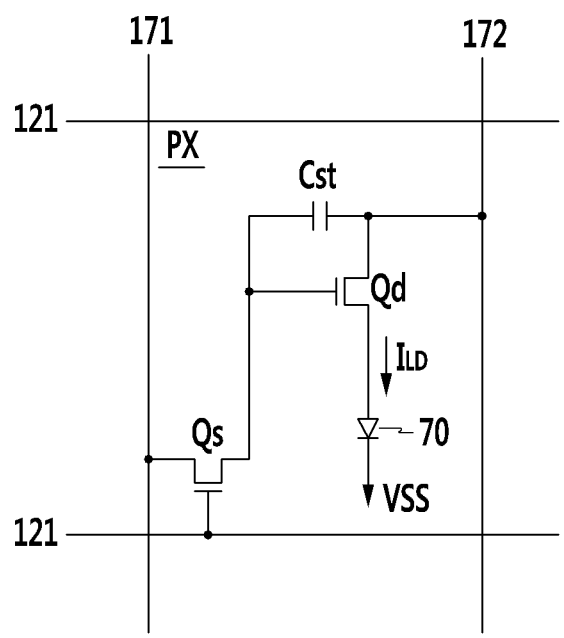
FIG. 14 is an equivalent circuit view of one pixel of an organic light emitting device panel according to the exemplary embodiment.

Referring to FIG. 14, the organic light emitting display panel including a pixel will be specifically described.

FIG. 14 is an equivalent circuit view of one pixel of an organic light emitting display panel according to some embodiments.

Referring to FIG. 14, the organic light emitting display panel includes a plurality of signal lines 121, 171, and 172 formed on a substrate, and a pixel (PX) connected thereto.

The signal lines include a scanning signal line 121 transferring a gate signal (or a scan signal), a data line 171 transferring a data signal, a driving voltage line 172 transferring a driving voltage, and the like. The scan signal lines 121 extend in an approximate horizontal direction and are substantially parallel to each other, and the data lines 171 extend in an approximate vertical direction and are substantially parallel to each other. The driving voltage line 172 extending in an approximate vertical direction is illustrated, but the driving voltage line 172 may extend in a horizontal direction or a vertical direction or may be formed to have a mesh shape.

One pixel (PX) includes a switching transistor (Qs), a driving transistor (Qd), a storage capacitor (Cst), and an organic light emitting diode 70.

The switching transistor (Qs) has a control terminal, an input terminal, and an output terminal, and the control terminal is connected to the scan signal line 121, the input terminal is connected to the data line 171, and the output terminal is connected to the driving transistor (Qd). The switching transistor (Qs) responses the scan signal received from the scan signal line 121 to transfer the data signal received from the data line 171 to the driving transistor (Qd).

The driving transistor (Qd) has a control terminal, an input terminal, and an output terminal, and the control terminal is connected to the switching transistor (Qs), the input terminal is connected to the driving voltage line 172, and the output terminal is connected to the organic light emitting diode 70. The driving transistor (Qd) allows the output current (ILD) to vary based on the voltage applied between the control terminal and the output terminal to flow therethrough.

The capacitor (Cst) is connected between the control terminal and the input terminal of the driving transistor (Qd). This capacitor (Cst) charges the data signal applied to the control terminal of the driving transistor (Qd) and maintains the data signal even after the switching transistor (Qs) is turned off.

In some embodiments, the organic light emitting diode 70 may have an anode connected to the output terminal of the driving transistor (Qd) and a cathode connected to a common voltage (Vss). The organic light emitting diode 70 displays an image by emitting light while the intensity thereof is changed according to the output current (ILD) of the driving transistor (Qd). The organic light emitting diode 70 may include an organic material intrinsically emitting any one or at least one light of primary colors such as the three primary colors of red, green, and blue, and the organic light emitting diode device displays a desired image by a spatial sum of the colors.

Referring to FIG. 13 again, a touch panel 820 may be a capacitance type or a pressure sensitive type, and senses a touch operation of a user to the organic light emitting diode display.

A grid layer 840 may be any one of the grid layers of FIGS. 1 to 3, and may be the grid layer of FIG. 1 in FIG. 13.

The grid layer 840 serves to reduce reflection of external light by a display panel which emits light and by the touch panel which senses the touch operation. Therefore, the use of the grid layer can minimize the a loss of light emitted from the organic light emitting diode to the outside and improve visibility of the entire display device.

A window 860 is positioned on an optical film and is formed of a transparent material so that a user can see a display portion at a front side of the display panel. For example, the window 860 may be formed of a single layer or a plurality of layers including tempered glass or a polymer material. The polymer material may be polycarbonate (PC), polymethyl methacrylate (PMMA), polyarylate (PAR), polyethersulfone (PES), polyethylene terephthalate (PET), polyethylene naphthalate (PEN), or any combinations thereof.

The window 860 is positioned at the outermost portion of the display device to prevent an internal display panel or the like from being damaged by an external impact.

Figure 15:
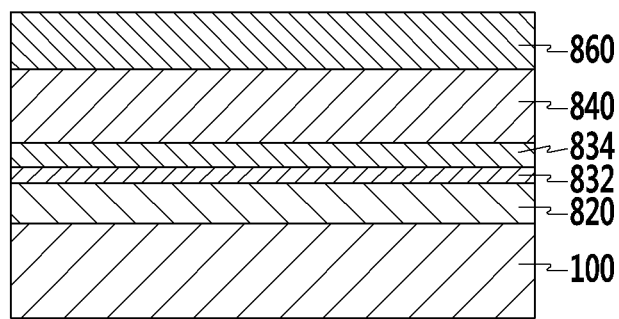
FIGS. 15 and 16 are schematic cross-sectional views of an organic light emitting diode device according to some embodiments.
Figure 16:
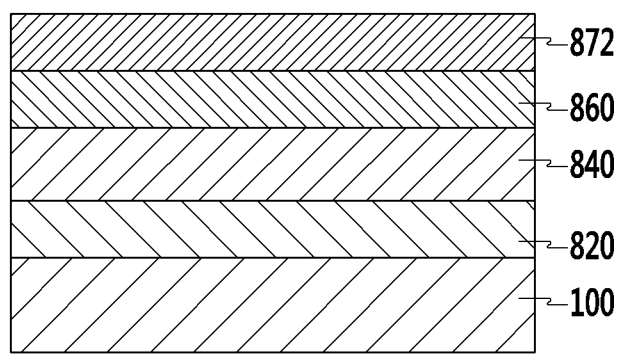

FIGS. 15 and 16 are schematic cross-sectional views of an organic light emitting diode display according to some embodiments.

Since the interlayer constitution of the OLED device of FIGS. 15 and 16 is mostly identical to that of FIG. 14, only a different portion will be specifically described.

The organic light emitting diode display of FIG. 15 includes a display panel 800, a touch panel 820 positioned on the display panel 800, a retardation layer 832 positioned on the touch panel 820, an optical clear adhesive (OCA) layer 834 positioned on the retardation layer 832, a grid layer 840 positioned on the optical clear adhesive layer 834, and a window 860 positioned on the grid layer 840.

The retardation layer 832 may delay a phase by λ/4. A portion of external light passes through the grid layer, passes through the retardation layer, and is reflected on an electrode of the display panel. The reflected light passes through the retardation layer again and the phase is delayed by 90°, and thus the light does not pass through the grid layer and is dissipated. Accordingly, contrast of the organic light emitting diode display may be increased.

The organic light emitting diode display of FIG. 16 further includes a display panel 800, a touch panel 820 positioned on the display panel 800, a grid layer 840 positioned on the touch panel 820, a window 860 positioned on the grid layer 840, and an antireflection layer or an antifingerprint layer positioned on the window 860.

In the aforementioned embodiments, position of the grid layer directly beneath the window is described, but the grid layer may be formed at various positions, such as on the window, beneath or directly on the retardation layer 832, or directly on the touch panel, if necessary.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. An organic light emitting diode device comprising:
   a display panel;
   a grid layer positioned on the display panel and including a plurality of protrusions, comprising a first protrusion and a second protrusion formed on a surface of the first protrusion;
   a window positioned on the grid layer;
   a touch panel positioned between the display panel and the grid layer; and
   a retardation layer positioned between the touch panel and the grid layer.

2. The organic light emitting diode device of claim 1, wherein a protection layer is disposed between the first protrusion and the second protrusion.

3. The organic light emitting diode device of claim 2, wherein:
   the protection layer is formed of Ti (titanium) or Cr (chrome).

4. The organic light emitting diode device of claim 1, wherein:
   the first protrusion is formed of Al (aluminum).

5. The organic light emitting diode device of claim 1, wherein:
   a thickness of the protection layer is ⅕ or less of the thickness of the first protrusion.

6. The organic light emitting diode device of claim 1, wherein:
   the second protrusion is formed of aluminum oxide and has a black color.

7. The organic light emitting diode device of claim 1, wherein:
   the thickness of the second protrusion is from about 20 nm to about 30 nm.

8. The organic light emitting diode device of claim 1, wherein:
   the height of the plurality of protrusions is equal to or larger than about 150 nm, and the interval between the protrusions is equal to or less than about 50 nm.

9. The organic light emitting diode device of claim 1, further comprising:
   an optical clear adhesive layer positioned between the retardation layer and the grid layer.

10. The organic light emitting diode device of claim 1, wherein:
    the window is formed of a single layer or a plurality of layers comprising polycarbonate (PC), polymethyl methacrylate (PMMA), polyarylate (PAR), polyethersulfone (PES), polyethylene terephthalate (PET), polyethylene naphthalate (PEN), or any combinations thereof.

* * * * *